United States Patent
Hwang

(10) Patent No.: US 10,177,015 B2
(45) Date of Patent: Jan. 8, 2019

(54) METHOD OF TRANSFERRING LIGHT-EMITTING DIODES

(71) Applicant: SAMSUNG DISPLAY CO., LTD., Yongin-si, Gyeonggi-Do (KR)

(72) Inventor: Insun Hwang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 29 days.

(21) Appl. No.: 15/434,246

(22) Filed: Feb. 16, 2017

(65) Prior Publication Data
US 2017/0243773 A1   Aug. 24, 2017

(30) Foreign Application Priority Data
Feb. 19, 2016 (KR) .......................... 10-2016-0019775

(51) Int. Cl.
H01L 21/67 (2006.01)
H01L 33/00 (2010.01)
H01L 33/62 (2010.01)
H01L 21/683 (2006.01)
H01L 21/677 (2006.01)

(52) U.S. Cl.
CPC .. *H01L 21/67144* (2013.01); *H01L 21/67721* (2013.01); *H01L 21/6835* (2013.01); *H01L 33/0095* (2013.01); *H01L 33/62* (2013.01); *H01L 2933/0066* (2013.01)

(58) Field of Classification Search
CPC ..... H01L 23/552; H01L 23/585; H01L 23/58; H01L 23/573; H01L 23/5286; H01L 23/522; H01L 23/52; H01L 23/5225; H01L 23/528; H01L 21/768

USPC .......................................................... 257/659
See application file for complete search history.

(56) References Cited

U.S. PATENT DOCUMENTS

| | | | |
|---|---|---|---|
| 2003/0034120 A1 | 2/2003 | Yanagisawa et al. | |
| 2010/0259164 A1* | 10/2010 | Oohata | H01L 25/0753 313/505 |
| 2014/0084482 A1* | 3/2014 | Hu | H01L 24/06 257/774 |
| 2014/0159064 A1* | 6/2014 | Sakariya | H01L 25/0753 257/88 |
| 2015/0115308 A1* | 4/2015 | Lin | H01L 33/0095 257/99 |
| 2016/0111405 A1 | 4/2016 | Bibl et al. | |

FOREIGN PATENT DOCUMENTS

| | | |
|---|---|---|
| JP | 10-321910 | 12/1998 |
| KR | 10-2012-0107383 | 10/2012 |
| WO | 2014204695 | 12/2014 |

* cited by examiner

*Primary Examiner* — Fernando L Toledo
*Assistant Examiner* — Adam S Bowen
(74) *Attorney, Agent, or Firm* — F. Chau & Associates, LLC.

(57) ABSTRACT

A method of transferring light-emitting diodes including picking up the light-emitting diodes from a base substrate by using a first stamper; rotating the light-emitting diodes by about 90 degrees and arranging the light-emitting diodes over the first stamper or a sacrificial substrate; picking up the rotated light-emitting diodes arranged over the first stamper or the sacrificial substrate by using a second stamper; and releasing the light-emitting diodes from the second stamper towards a display substrate.

20 Claims, 18 Drawing Sheets

METHOD OF TRANSFERRING LIGHT-EMITTING DIODES

CROSS-REFERENCE TO RELATED APPLICATION

This application claims priority under 35 U.S.C. § 119 to Korean Patent Application No. 10-2016-0019775, filed on Feb. 19, 2016 in the Korean Intellectual Property Office, the disclosure of which is incorporated by reference herein in its entirety.

TECHNICAL FIELD

Exemplary embodiments of the present invention relate to a method of transferring light-emitting diodes.

DISCUSSION OF RELATED ART

Light-emitting diodes (LEDs) may be semiconductor devices in which holes and electrons are injected. The holes and electrons may be injected when a forward voltage is applied to a PN junction diode. Energy generated by a recombination of the holes and the electrons may be converted into light energy.

LEDs may be classified into inorganic LEDs and organic LEDs. LEDs may be used, for example, in backlights of liquid crystal display (LCD) televisions, lighting, electronic display boards, small electronic devices, such as mobile phones, and relatively large-scale televisions.

SUMMARY

At least one exemplary embodiment of the present invention provides a method of transferring light-emitting diodes. The method includes picking up the light-emitting diodes from a base substrate by using a first stamper; rotating the light-emitting diodes by about 90 degrees and arranging the light-emitting diodes over the first stamper or a sacrificial substrate; picking up the rotated light-emitting diodes arranged over the first stamper or the sacrificial substrate by using a second stamper; and releasing the light-emitting diodes from the second stamper towards a display substrate.

The rotating and arranging of the light-emitting diodes may include rotating the first stamper on which the light-emitting diodes are arranged. The rotating and arranging of the light-emitting diodes may also include rotating the light-emitting diodes by about 90 degrees by pressing the light-emitting diodes on the first stamper.

After the light-emitting diodes are rotated by about 90 degrees, a layer stack direction of the light-emitting diodes arranged over the first stamper may be substantially perpendicular to a layer stack direction of the light-emitting diodes arranged over the base substrate.

The rotating and arranging of the light-emitting diodes may include releasing the light-emitting diodes from the first stamper towards the sacrificial substrate. The rotating and arranging of the light-emitting diodes may also include rotating the light-emitting diodes by about 90 degrees by stretching the sacrificial substrate.

An upper surface of the sacrificial substrate may include a first region which is adhesive and a second region which is not adhesive. After the sacrificial substrate is stretched, a layer stack direction of the light-emitting diodes arranged above the first region of the sacrificial substrate may be substantially perpendicular to a layer stack direction of the light-emitting diodes arranged over the base substrate.

Before the sacrificial substrate is stretched, an upper surface of the sacrificial substrate may include a first region. The first region may be substantially perpendicular to a lower surface of the sacrificial substrate. The upper surface of the sacrificial substrate may also include a second region. The second region may form an acute angle with the first region.

The first region of the sacrificial substrate may include an adhesive.

The light-emitting diodes arranged over the base substrate may include a structure in which a first semiconductor layer, an intermediate layer, and a second semiconductor layer are stacked on the base substrate in a first direction. The first direction may be substantially perpendicular to an upper surface of the base substrate. The light-emitting diodes arranged over the display substrate may include a structure in which the first semiconductor layer, the intermediate layer, and the second semiconductor layer are stacked on the display substrate in a second direction. The second direction may be substantially perpendicular to the first direction.

The method may further include electrically connecting the light-emitting diodes to a first electrode and a second electrode. The first electrode and the second electrode may be disposed on a layer of the display substrate.

The electrically connecting of the light-emitting diodes may include forming a first contact portion and a second contact portion. The first contact portion may be used to connect a first semiconductor layer of the light-emitting diodes to the first electrode of the display substrate. The second contact portion may be used to connect a second semiconductor layer of the light-emitting diodes to the second electrode of the display substrate.

At least one exemplary embodiment of the present invention provides a method of transferring light-emitting diodes. The method includes picking up the light-emitting diodes from a base substrate by using a first stamper; rotating the first stamper on which the light-emitting diodes are disposed over by about 90 degrees; rotating the light-emitting diodes by about 90 degrees by pressing the light-emitting diodes over the first stamper; picking up the rotated light-emitting diodes disposed over the first stamper by using a second stamper; and releasing the light-emitting diodes from the second stamper towards a display substrate.

After the light-emitting diodes rotate by about 90 degrees, a layer stack direction of the light-emitting diodes disposed over the first stamper may be substantially perpendicular to a layer stack direction of the light-emitting diodes disposed over the base substrate.

The light-emitting diodes disposed over the base substrate may include a structure in which a first semiconductor layer, an intermediate layer, and a second semiconductor layer are stacked on the base substrate in a first direction. The first direction may be substantially perpendicular to an upper surface of the base substrate. The light-emitting diodes disposed over the display substrate may include a structure in which the first semiconductor layer, the intermediate layer, and the second semiconductor layer are stacked on the display substrate in a second direction. The second direction may be substantially perpendicular to the first direction.

The light-emitting diodes may be picked up from the base substrate by lowering the first stamper.

The method may further include electrically connecting the light-emitting diodes to a first electrode and a second electrode. The first electrode and the second electrode may be disposed on a layer of the display substrate.

At least one exemplary embodiment of the present invention provides a method of transferring light-emitting diodes.

The method includes picking up the light-emitting diodes from a base substrate by using a first stamper; releasing the light-emitting diodes from the first stamper towards a sacrificial substrate; rotating the light-emitting diodes disposed over the sacrificial substrate by about 90 degrees by stretching the sacrificial substrate; picking up the rotated light-emitting diodes disposed over the sacrificial substrate by using a second stamper; and releasing the light-emitting diodes from the second stamper towards a display substrate.

An upper surface of the sacrificial substrate may include a first region which is adhesive and a second region which is not adhesive. After the sacrificial substrate is stretched, a layer stack direction of the light-emitting diodes disposed over the first region may be substantially perpendicular to a layer stack direction of the light-emitting diodes disposed over the base substrate.

The light-emitting diodes disposed over the base substrate may include a structure in which a first semiconductor layer, an intermediate layer, and a second semiconductor layer are stacked on the base substrate in a first direction. The first direction may be substantially perpendicular to an upper surface of the base substrate. The light-emitting diodes disposed over the display substrate may include a structure in which the first semiconductor layer, the intermediate layer, and the second semiconductor layer are stacked in a second direction. The second direction may be substantially perpendicular to the first direction.

The light-emitting diodes may be picked up from the base substrate by lowering the first stamper.

The method may further include electrically connecting the light-emitting diodes to a first electrode and a second electrode. The first electrode and the second electrode may be disposed on a layer of the display substrate.

BRIEF DESCRIPTION OF THE DRAWINGS

These and/or other aspects will become apparent and more readily appreciated from the following description of the exemplary embodiments, taken in conjunction with the accompanying drawings, in which.

DETAILED DESCRIPTION OF THE EMBODIMENTS

Figure 1:
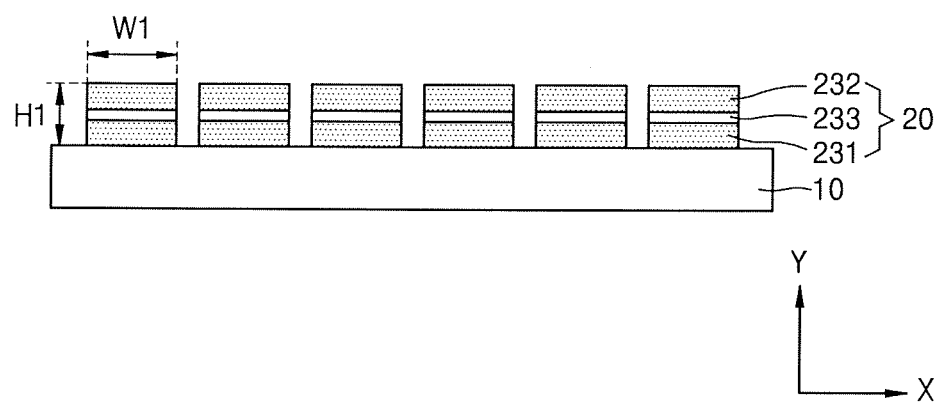
FIGS. 1 to 6 are cross-sectional views illustrating a method of transferring light-emitting diodes according to an exemplary embodiment of the present invention.

As the present invention allows for various changes and numerous embodiments, particular exemplary embodiments of the present invention will be illustrated in the drawings and described in detail herein. Hereinafter, aspects and features of the embodiments of the present invention and a method for accomplishing them will be described more fully with reference to the accompanying drawings; however the present invention may be embodied in many different forms and should not be construed as being limited to the exemplary embodiments set forth herein.

The present invention will be described in detail by explaining exemplary embodiments of the present invention with reference to the drawings. Like reference numerals refer to like elements throughout, and repeated descriptions thereof may be omitted.

Sizes of components in the drawings may be exaggerated for convenience of explanation, and the following exemplary embodiments of the present invention are not limited thereto.

It will be understood that when a layer, region, or component is referred to as being "formed on" or "disposed on" another layer, region or component, it can be directly or indirectly formed or disposed on the other layer, region, or component. Thus, intervening layers, regions, or components may be present.

The term "substantially" as used herein may be inclusive of the stated property or characteristic and a deviation from the stated property or characteristic. For example, "substantially perpendicular" may mean perpendicular at a 90 degree angle, or positioned at an angle similar to (e.g., greater than or less than) 90 degrees.

The term "about" as used herein may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis, and the z-axis are not limited to three axes of the rectangular coordinate system, and may be interpreted in a broader sense. For example, the x-axis, the y-axis, and the z-axis may be substantially perpendicular to one another, or may represent different directions that are not substantially perpendicular to one another.

When a certain embodiment may be implemented differently, a specific process order may be performed differently from the described order. For example, two consecutively described processes may be performed at substantially the same time or performed in an order opposite to the described order.

FIGS. 1 to 6 are cross-sectional views illustrating a method of transferring light-emitting diodes according to an exemplary embodiment of the present invention.

A light-emitting transfer may transfer light-emitting diodes 20 from a base substrate 10 to a display substrate 80. The light-emitting transfer may be disposed within a chamber. Internal pressure of the chamber may vary. For example, the internal pressure of the chamber may be the same as or similar to atmospheric pressure or a vacuum while processes described herein are performed inside the chamber. The light-emitting transfer may include a first stamper 30. The light-emitting transfer may include a second stamper 70. The light-emitting transfer may further include a stage, a transport unit, a vision unit, a rotation driving unit, a linear driving unit, or a controller; however, exemplary embodiments of the present invention are not limited thereto. Hereinafter, the first stamper 30 and the second stamper 70 will be described. The base substrate 10 and the display substrate 80 may be mounted above a surface of the stage. The base substrate 10 and the display substrate 80 may be mounted above the surface of the stage in a plate form.

Referring to FIG. 1, the light-emitting diodes 20 may be formed on the base substrate 10.

The base substrate 10 may be a conductive substrate or an insulating substrate. For example, the base substrate 10 may include at least one of sapphire ($Al_2O_3$), SiC, Si, GaAs, GaN, ZnO, Si, GaP, InP, Ge, or $Ga_2O_3$. The base substrate 10 may be a wafer. Light-emitting diodes 20 may be directly formed on the wafer. Alternatively, the base substrate 10 may be a temporary substrate. Light-emitting diodes 20 transferred from a wafer may be re-arranged on the temporary substrate.

Each light-emitting diode 20 may include a first semiconductor layer 231, a second semiconductor layer 232, and an intermediate layer 233. The intermediate layer 233 may be disposed between the first semiconductor layer 231 and the second semiconductor layer 232. The first semiconductor layer 231, the intermediate layer 233, and the second semiconductor layer 232 may be formed by using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like; however, exemplary embodiments of the present invention are not limited thereto.

The light-emitting diode 20 may have a structure in which the first semiconductor layer 231, the intermediate layer 233, and the second semiconductor layer 232 are sequentially stacked in a direction (i.e., a Y direction). The direction may be substantially perpendicular to an upper surface of the base substrate 10. The light-emitting diode 20 may have a width W1. The light-emitting diode 20 may have a height H1. The width W1 may be a length in a direction (i.e., an X direction). The direction may be substantially parallel to the upper surface of the base substrate 10. The height H1 may be a length in a direction substantially perpendicular to the upper surface of the base substrate 10. The width W1 of the light-emitting diode 20 may be greater than the height H1 of the light-emitting diode 20.

Referring to FIG. 1, the first semiconductor layer 231 may be in direct contact with the upper surface of the base substrate 10. However, exemplary embodiments of the present invention are not limited thereto. The second semiconductor layer 232 may be in direct contact with the upper surface of the base substrate 10.

The first semiconductor layer 231 may include, for example, a p-type semiconductor layer. The p-type semiconductor layer may include a semiconductor material. The semiconductor material may have a composition formula of $In_xAl_yGa_{1-x-y}N$ ($0 \leq x \leq 1$, $0 \leq y \leq 1$, $0 \leq x+y \leq 1$), for example, a material selected from GaN, AlN, AlGaN, InGaN, InN, InAlGaN, or AlInN; however, exemplary embodiments of the present invention are not limited thereto. The first semiconductor layer 231 may be doped with p-type dopants. The p-type dopants may include magnesium (Mg), zinc (Zn), calcium (Ca), strontium (Sr), or barium (Ba).

The second semiconductor layer 232 may include, for example, an n-type semiconductor layer. The n-type semiconductor layer may include a semiconductor material. The semiconductor material may have a composition formula of $In_xAl_yGa_{1-x-y}N$ ($0 \leq x \leq 1$, $0 \leq y \leq 1$, $0 \leq x+y \leq 1$), for example, a material selected from GaN, AlN, AlGaN, InGaN, InN, InAlGaN, or AlInN; however, exemplary embodiments of the present invention are not limited thereto. The second semiconductor layer 232 may be doped with n-type dopants. The n-type dopants may include silicone (Si), germanium (Ge), or tin (Sn).

However, exemplary embodiments of the present invention are not limited thereto. For example, the first semiconductor layer 231 may include a n-type semiconductor layer. The second semiconductor layer 232 may include a p-type semiconductor layer.

The intermediate layer 233 may be disposed an area in which electrons and holes recombine. As electrons and holes recombine, the electrons and holes may transition to a low energy level. Accordingly, light having a wavelength corresponding to the energy level may be emitted. The intermediate layer 233 may include, for example, a semiconductor material. The semiconductor material may have a composition formula of $In_xAl_yGa_{1-x-y}N$ ($0 \leq x \leq 1$, $0 \leq y \leq 1$, $0 \leq x+y \leq 1$). The semiconductor material may have a single quantum well structure or a multi quantum well (MQW) structure. The intermediate layer 233 may have a quantum wire structure or a quantum dot structure.

When a mounting method is performed in which the first semiconductor layers 231 and the second semiconductor layers 232 of the light-emitting diodes 20 are stacked in a direction substantially perpendicular to an upper surface of the display substrate 80, an etching process, an electrode formation process, or a similar process for exposing the first semiconductor layers 231 and the second semiconductor layers 232 in the same direction may be performed to manufacture a display apparatus. However, these subsequent processes may be complex. Thus, as the light-emitting diodes 20 decrease in size, an area of the light-emitting diodes 20 may decrease.

Figure 6:
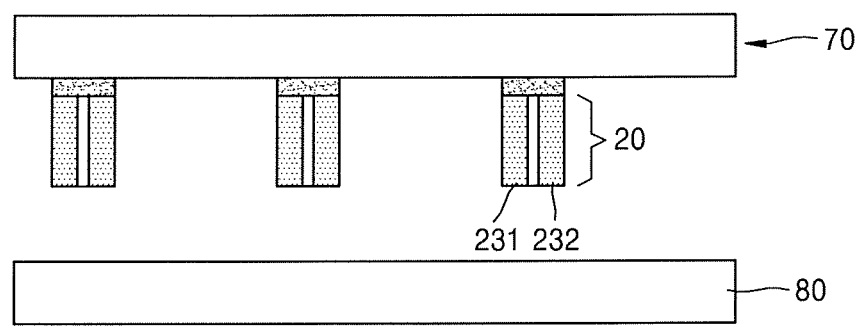

According to an exemplary embodiment of the present invention, as illustrated in FIG. 6, the first semiconductor layers 231 and the second semiconductor layers 232 of the light-emitting diodes 20 may be arranged above the display substrate 80. The first semiconductor layers 231 and the second semiconductor layers 232 of the light-emitting diodes 20 may be arranged above the display substrate 80 in a direction substantially parallel to the surface of the display substrate 80. Accordingly, the display apparatus may be manufactured with a decreased area loss of the light-emitting diodes 20. Additionally, the display apparatus may be manufactured by a simplified process.

Figure 2:
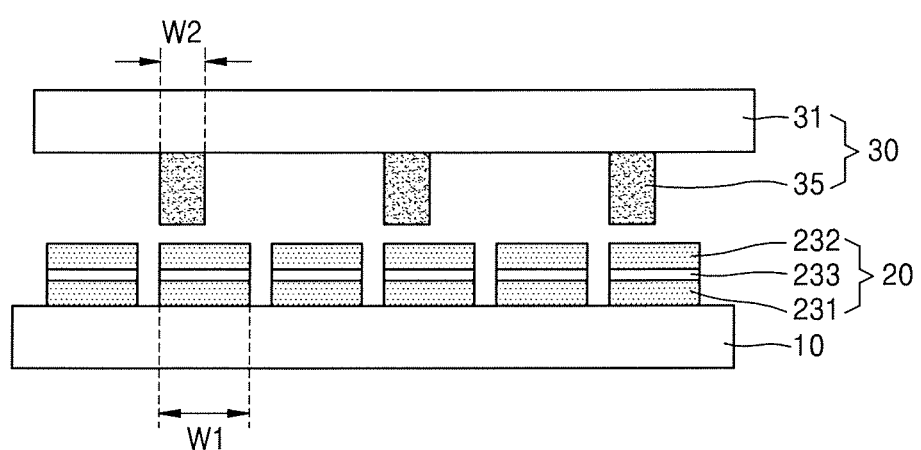

Referring to FIG. 2, the first stamper 30 of the light-emitting transfer may be disposed above the base substrate 10.

According to images captured, for example, by a vision unit, a position of the first stamper 30 and a position the base substrate 10 may be identified. Thus, the position of the first stamper 30 may be changed. For example, an alignment mark may be formed above the base substrate 10. The position of the first stamper 30 may be adjusted by identifying the position of the first stamper 30 and the position of the base substrate 10 based on images captured, for example, by the vision unit. According to an exemplary embodiment of the present invention, the position of the first stamper 30 may be adjusted by measuring a shape of the first stamper 30 and a shape of the base substrate 10 by using, for example, the vision unit. A method of adjusting the position of the first stamper 30 using the vision unit is not limited thereto. All methods of adjusting the position of the first stamper 30 by identifying the position of the first stamper 30 and the position of the base substrate 10 may be used.

The first stamper 30 may include a plate 31. The first stamper 30 may also include pick-up portions 35. The pick-up portions 35 may protrude from a surface of the plate 31. The pick-up portions 35 may have an embossed pattern.

The plate 31 may include a metallic material. The metallic material may have a relatively high strength. The plate may include a plastic material. However, exemplary embodiments of the present invention are not limited thereto.

The pick-up portions 35 may include the same material as the plate 31. The pick-up portions 35 may be integrally formed with the plate 31. Alternatively, the pick-up portions 35 may be formed separately from the plate 31. According to an exemplary embodiment of the present invention, the pick-up portions 35 may include an elastic material. For example, the pick-up portions 35 may include natural or synthetic rubber, or a silicone-based polymer; however, exemplary embodiments of the present invention are not limited thereto. The silicone-based polymer may include polydimethylsiloxane (PDMS) or hexamethyldisiloxane (HMDSO); however, exemplary embodiments of the present invention are not limited thereto. The pick-up portions 35 may include various materials. The pick-up portions 35 may include polyurethane or polyurethane acrylate.

A width W2 of the pick-up portions 35 may be smaller than the width W1 of the light-emitting diode 20.

The pick-up portions 35 may attach the light-emitting diodes 20 thereto. The pick-up portions 35 may attach the light-emitting diodes 20 thereto using electrostatic force, magnetic force, absorptive power, or adhesion. However, the pick-up portions 35 are not limited thereto. The pick-up portions 35 may include all units or structures that may attach the light-emitting diodes 20 to the pick-up portions 35. There may be a plurality of pick-up portions 35. The pick-up portions 35 may be spaced apart from each other in a direction of the plate 31, for example, in a horizontal direction in a vertical cross-section as illustrated in FIG. 2.

Figure 3:
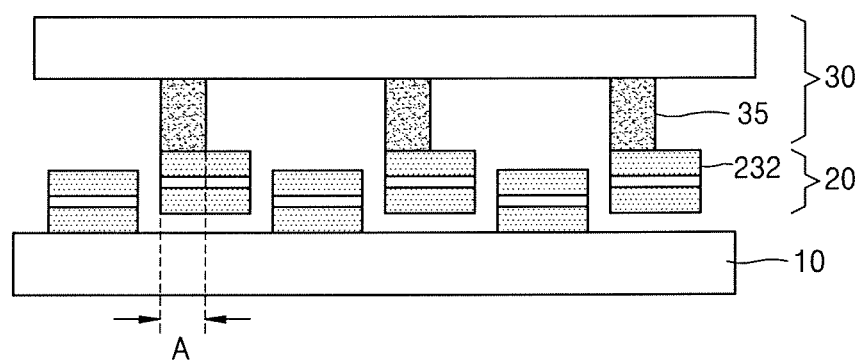

Referring to FIG. 3, the light-emitting transfer may pick up the light-emitting diodes 20 from the base substrate 10 by lowering the first stamper 30. The pick-up portions 35 of the first stamper 30 may pick up the light-emitting diode 20 by attaching to a portion A of an upper surface of the second semiconductor layer 232 of the light-emitting diode 20.

Figure 4A:
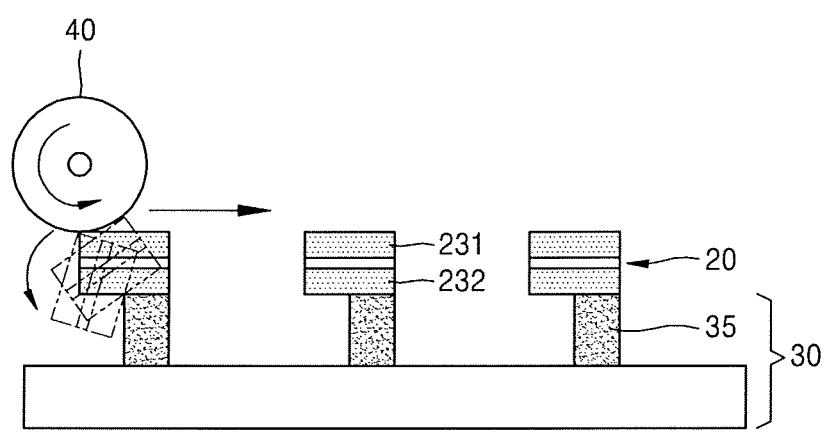

Referring to FIG. 4A, the light-emitting transfer may then rotate the light-emitting diodes 20, which are attached to the first stamper 30, by about 90 degrees. Thus, the light-emitting diodes 20 may be rearranged above the first stamper 30.

The light-emitting transfer may rotate the first stamper 30 by about 180 degrees. Accordingly, an upper surface of the first semiconductor layer 231 of the light-emitting diode 20 may be exposed in a direction opposite to a direction facing the base substrate 10 as illustrated in FIG. 4A.

According to an exemplary embodiment of the present invention, as illustrated in FIG. 4A, the light-emitting transfer may press the light-emitting diodes 20 attached to the first stamper 30 by using, for example, a pressing roll 40. The light-emitting transfer may rotate the light-emitting diodes 20 by about 90 degrees. Since a surface of the pressing roll 40 is not adhesive, the light-emitting diodes 20 might not be attached to the pressing roll 40. Thus, the light-emitting diodes 20 may be separated from the pick-up portions 35 by being rotated by about 90 degrees. Accordingly, the light-emitting diodes 20 may be mounted adjacent to the pick-up portions 35.

Figure 4B:
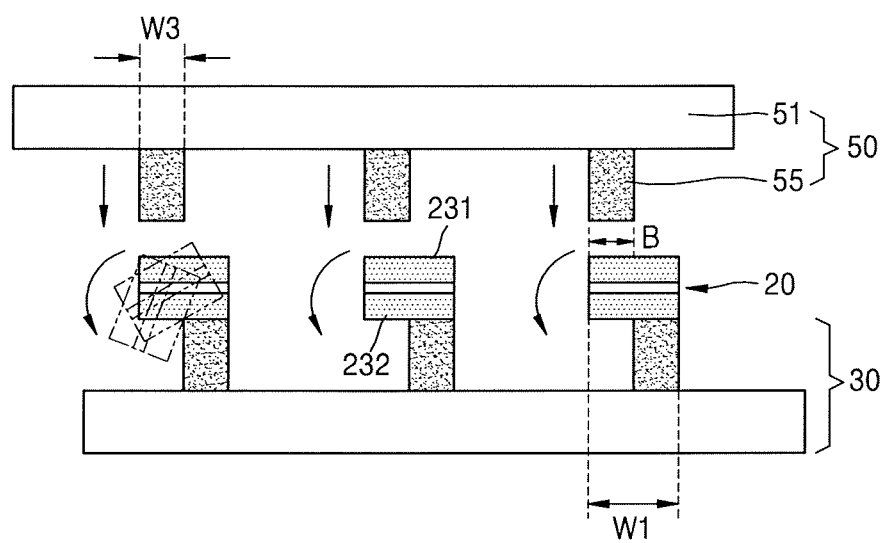

According to an exemplary embodiment of the present invention, as illustrated in FIG. 4B, the light-emitting transfer may press the light-emitting diodes 20 attached to the first stamper 30 by using, for example, a pressing stamper 50. The light-emitting transfer may rotate the light-emitting diodes 20 by about 90 degrees.

The pressing stamper 50 may include a plate 51. The pressing stamper 50 may also include a protrusion pattern 55. The protrusion pattern 55 may protrude from a surface of the plate 51. There may be a plurality of protrusion patterns 55. The protrusion patterns 55 may be arranged apart from each other in a direction of the plate 51, for example, in a horizontal direction in a vertical cross-section as illustrated in FIG. 4B. A width W3 of the protrusion pattern 55 may be smaller than the width W1 of the light-emitting diode 20.

The light-emitting transfer may arrange the pressing stamper 50 above the first stamper 30. Thus, the protrusion patterns 55 of the pressing stamper 50 may be aligned with portions B of the first semiconductor layers 231. The protrusion patterns 55 might not overlap with the pick-up portions 35 of the first stamper 30.

The light-emitting transfer may rotate the light-emitting diodes 20 by pressing the pressing stamper 50 in a direction toward the first stamper 30. Since surfaces of the protrusion patterns 55 of the pressing stamper 50 are not adhesive, the light-emitting diodes 20 might not be attached to the pressing stamper 50. Thus, the light-emitting diodes 20 may be separated from the pick-up portions 35 by being rotated by about 90 degrees. Accordingly, the light-emitting diodes 20 may be mounted adjacent to the pick-up portions 35.

Figure 5:
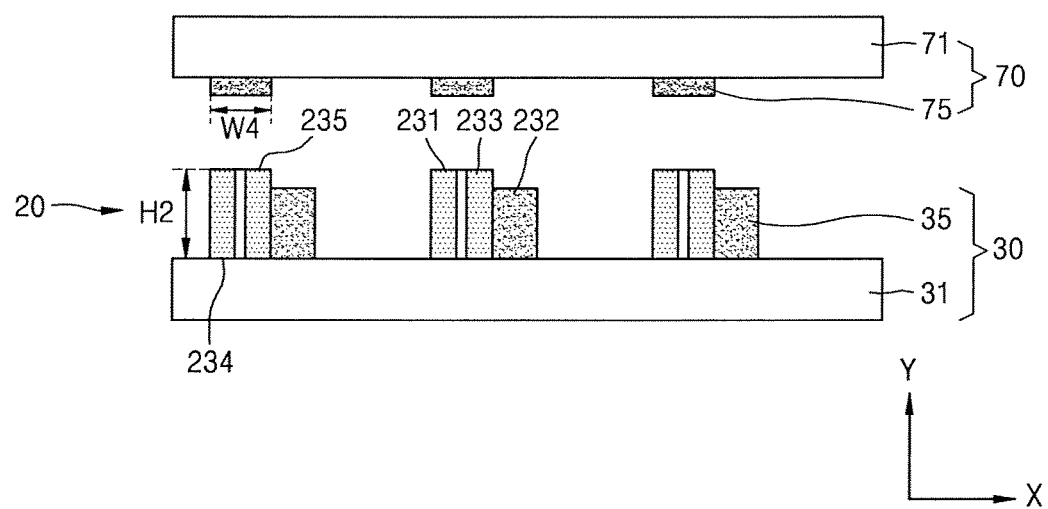

Referring to FIG. 5, the light-emitting diodes 20 may be substantially vertical after being rotated by about 90 degrees. The first semiconductor layers 231, the intermediate layers 233, and the second semiconductor layers 232 of the light-emitting diodes 20 may be stacked in a direction (i.e., an X direction). The direction may be substantially parallel to the upper surface of the base substrate 10. For example, a first surface 234 of the light-emitting diode 20 may be in direct contact with the plate 31 of the first stamper 30. A second surface 235 of the light-emitting diode 20 may be disposed opposite the first surface 234. The second surface 235 of the light-emitting diode 20 may be exposed in a direction opposite a direction facing the plate 31 of the first stamper 30.

According to an exemplary embodiment of the present invention, as illustrated in FIG. 5, side surfaces of the pick-up portions 35 of the first stamper 30 may be in direct contact with the light-emitting diodes 20. However, exemplary embodiments of the present invention are not limited thereto. Depending on sizes of the light-emitting diodes 20, the light-emitting diodes 20 might not directly contact the side surfaces of the pick-up portions 35 of the first stamper 30. Thus, the light-emitting diodes 20 may be vertically arranged around the pick-up portions 35 with space between adjacent pick-up portions 35.

The first stamper 30 may further include protrusions. The protrusions may be disposed around the pick-up portions 35. The protrusions may be disposed around the pick-up portions 35 at intervals in consideration of the sizes of the light-emitting diodes 20. The protrusions may assist in mounting the light-emitting diodes 20 adjacent to the pick-up portions 35 of the first stamper 30 after rotating the light-emitting diodes 20 by about 90 degrees.

The light-emitting transfer may arrange the second stamper 70 above the first stamper 30. Based on images captured by, for example, the vision unit, a position of the first stamper 30 and a position of the second stamper 70 may be identified. Thus, the position of the second stamper 70 may be changed.

The second stamper 70 may include a plate 71. The second stamper 70 may also include a pick-up portion 75. The pick-up portion 75 may protrude from the plate 71. The pick-up portion 75 may have an embossed pattern.

The plate 71 may include a metallic material. The metallic material may have a relatively high strength. The plate 71 may include a plastic material. However, exemplary embodiments of the present invention are not limited thereto.

The pick-up portion 75 may include substantially the same material as the plate 71. The pick-up portion 75 may be formed separately from the plate 71. Alternatively, the pick-up portion 75 may be integrally formed with the plate 71. According to an exemplary embodiment of the present invention, the pick-up portion 75 may include an elastic material. For example, the pick-up portion 75 may include a natural rubber, a synthetic rubber, or a silicone-based polymer; however, exemplary embodiments of the present invention are not limited thereto. The silicone-based polymer may include PDMS or HMDSO; however, exemplary embodiments of the present invention are not limited thereto. The pick-up portion 75 may include various materials. The pick-up portion 75 may include polyurethane or polyurethane acrylate.

A width W4 of the pick-up portion 75 may be smaller than the height H2 of the light-emitting diode 20.

The pick-up portion 75 may attach the light-emitting diode 20 thereto. The pick-up portion 75 may attach the light-emitting diode 20 thereto by using electrostatic force, magnetic force, adsorptive power, or adhesion. However, the pick-up portion 75 is not limited thereto. The pick-up portion 75 may include all units or structures that may attach the light-emitting diodes 20 to the pick-up portion 75. For example, the pick-up portion 75 may have a holder structure for holding the light-emitting diode 20. There may be a plurality of pick-up portions 75. The pick-up portions 75 may be arranged apart from each other in a direction of the plate 71, for example, in a horizontal direction in a vertical cross-section as illustrated in FIG. 5.

The light-emitting transfer may pick up the light-emitting diodes 20 from the first stamper 30 by lowering the second stamper 70. The second surface 235 of the light-emitting diode 20 may be attached to the pick-up portion 75 of the second stamper 70.

Referring to FIG. 6, the light-emitting transfer may arrange the second stamper 70, to which the light-emitting diodes 20 are attached, above the display substrate 80. Based on images captured by, for example, the vision unit, a position of the second stamper 70 and a position of display substrate 80 may be identified. Thus, the position of the second stamper 70 may be changed.

The light-emitting transfer may arrange the light-emitting diodes 20 at determined positions of the display substrate 80. The light-emitting transfer may release the light-emitting diodes 20 from the second stamper 70. Accordingly, the light-emitting diodes 20 may be mounted vertically above the display substrate 80.

The display substrate 80 may include a first electrode. The display substrate 80 may include a second electrode. The light-emitting transfer may arrange the light-emitting diodes 20 above the display substrate 80. The light-emitting transfer may arrange the light-emitting diodes 20 above the display substrate 80 such that the first semiconductor layer 231 and the second semiconductor layer 232 of the light-emitting diode 20 are electrically connected to the first electrode and the second electrode, respectively.

FIGS. 7 to 14 are cross-sectional views illustrating a method of transferring the light-emitting diodes according to an exemplary embodiment of the present invention. The description provided herein with reference to FIGS. 1 to 6 may be omitted.

Figure 7:
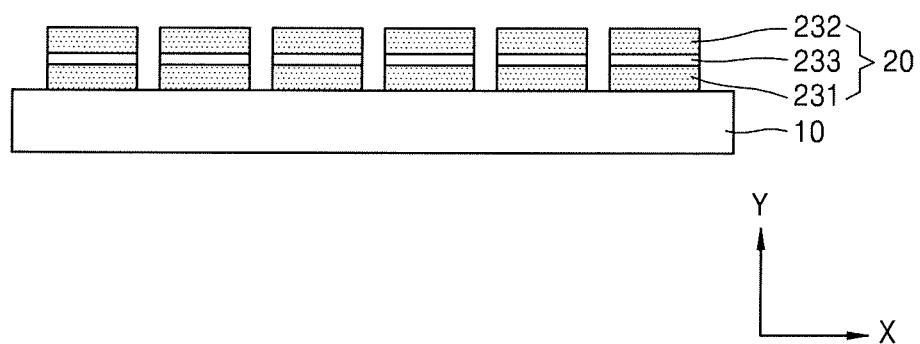
FIGS. 7 to 14 are cross-sectional views illustrating a method of transferring light-emitting diodes according to an exemplary embodiment of the present invention.

Referring to FIG. 7, the light-emitting diodes 20 may be disposed on the base substrate 10.

The base substrate 10 may be a conductive substrate or an insulating substrate. The base substrate 10 may be a wafer. The light-emitting diodes 20 may be directly formed on the wafer. Alternatively, the base substrate 10 may be a temporary substrate. The light-emitting diodes 20 transferred from a wafer may be rearranged on the temporary substrate.

Each light-emitting diode 20 may include the first semiconductor layer 231, the second semiconductor layer 232, and the intermediate layer 233. The intermediate layer 233 may be disposed between the first semiconductor layer 231 and the second semiconductor layer 232. The light-emitting diodes 20 may have a structure in which the first semiconductor layer 231, the intermediate layer 233, and the second semiconductor layer 232 are sequentially stacked in a direction (i.e., a Y direction). The direction may be substantially perpendicular to the upper surface of the base substrate 10.

Referring to FIG. 7, the first semiconductor layer 231 may be in direct contact with the upper surface of the base substrate 10. However, exemplary embodiments of the present invention are not limited thereto. Thus, the second semiconductor layer 232 may be in direct contact with the upper surface of the base substrate 10.

Figure 8:
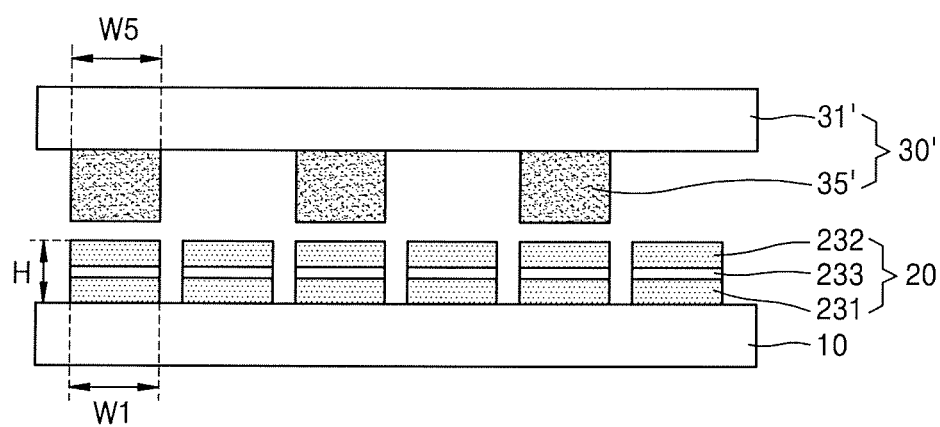

Referring to FIG. 8, a first stamper 30' of the light-emitting transfer may be arranged above the base substrate 10. Based on images captured by, for example, the vision unit, a position of the first stamper 30' and the position of the base substrate 10 may be identified. Thus, the position of the first stamper 30' may be changed.

The first stamper 30' may include a plate 31'. The first stamper 30' may also include a pick-up portion 35'. The pick-up portion 35' may protrude from a surface of the plate 31'. The pick-up portion 35' may have an embossed pattern.

The plate 31' may include a metallic material. The metallic material may have a relatively high strength. The plate 31' may include a plastic material. However, exemplary embodiments of the present invention are not limited thereto.

The pick-up portion 35' may include substantially the same material as the plate 31'. The pick-up portion 35' may be formed separately from the plate 31'. Alternatively, the pick-up portion 35' may be integrally formed with the plate 31'. According to an exemplary embodiment of the present invention, the pick-up portion 35' may include an elastic material. The first stamper 30' may be different from the first stamper 30 of FIG. 2 as a width W5 of the pick-up portion 35' may be greater than the width W1 of the light-emitting diode 20.

The pick-up portion 35' may attach the light-emitting diodes 20 thereto. The pick-up portion 35' may attach the light-emitting diodes 20 thereto by using electrostatic force, magnetic force, adsorptive power, or adhesion. However, the pick-up portion 35' is not limited thereto. The pick-up portion 35' may include all units or structures that may attach the light-emitting diodes 20 to the pick-up portion 35'. There may be a plurality of pick-up portions 35'. The pick-up portions 35' may be arranged apart from each other in a direction of the plate 31', for example, in a horizontal direction of a vertical cross-section as illustrated in FIG. 8.

Figure 9:
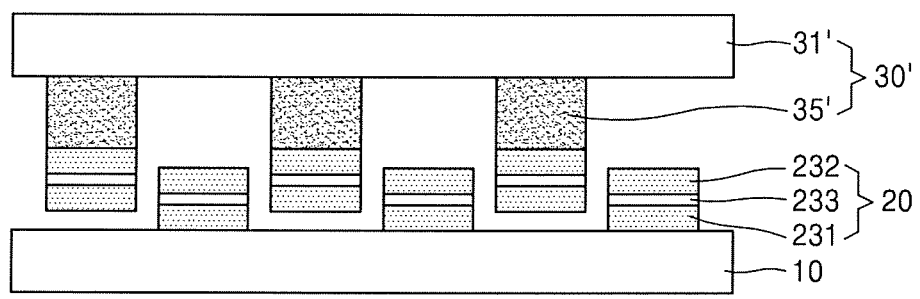

Referring to FIG. 9, the light-emitting transfer may pick up the light-emitting diodes 20 from the base substrate 10 by lowering the first stamper 30'. The upper surface of the second semiconductor layer 232 of the light-emitting diode 20 may be attached to the pick-up portion 35' of the first stamper 30'.

Figure 10:
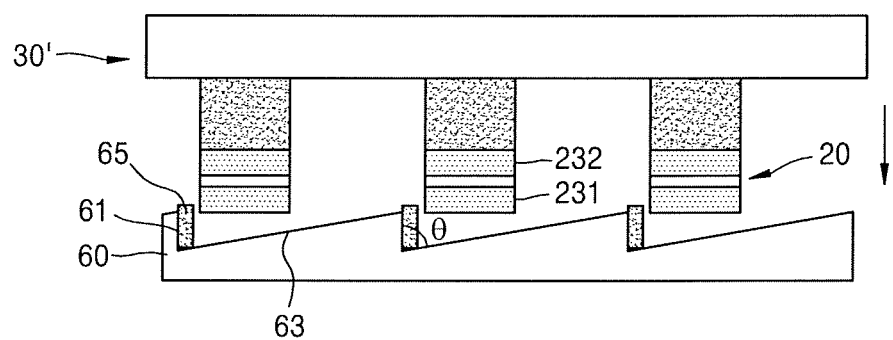

Referring to FIG. 10, the light-emitting transfer may arrange the first stamper 30' above a sacrificial substrate 60.

The sacrificial substrate 60 may be a flexible substrate. The flexible substrate may be stretchable. The sacrificial substrate 60 may include a PDMS material. The PDMS material may have a relatively high flexibility. Thus, the sacrificial substrate 60 may be stretched when pulled, for example, in a horizontal direction.

Portions of a surface of the sacrificial substrate 60 may have different adhesive properties. For example, the sacrificial substrate 60 may include a first region 61 and a second region 63. The first region 61 may be adhesive. The second region 63 might not be adhesive. The first region 61 may be substantially perpendicular to a lower surface of the sacrificial substrate 60. The second region 63 may be tapered to form an acute angle θ with the first region 61. An upper surface of the sacrificial substrate 60 might not be substantially flat due to the first region 61 and the second region 63. The first region 61 may include an adhesive 65, which may facilitate adhesion thereto.

Figure 11:
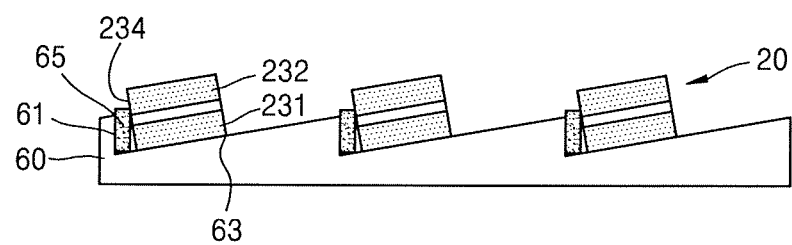

Referring to FIG. 11, the light-emitting transfer may release the light-emitting diodes 20 of the first stamper 30' towards the sacrificial substrate 60. The light-emitting diodes 20 released towards the sacrificial substrate 60 may be disposed in spaces defined by the first region 61 and the second region 63.

Figure 12:
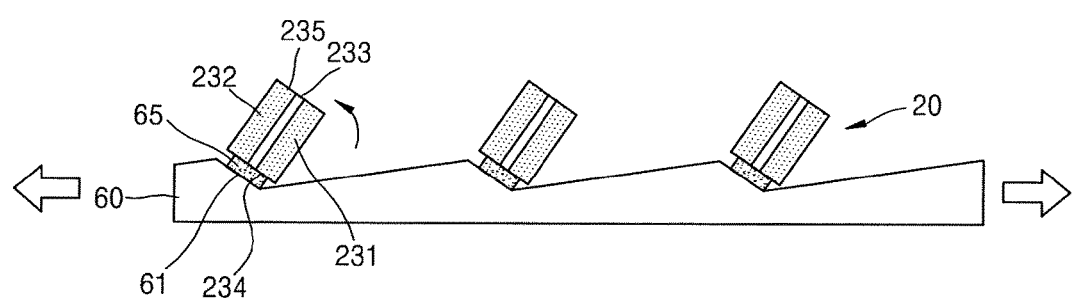

Referring to FIG. 12, the light-emitting transfer may stretch the sacrificial substrate 60 by pulling the sacrificial substrate 60 in, for example, a horizontal direction. Accordingly, the surface of the sacrificial substrate 60 may become substantially flatter. The light-emitting diodes 20 may rotate by about 90 degrees while the first surface 234 of the light-emitting diode 20 is attached to the first region 61, which may include the adhesive 65.

Figure 13:
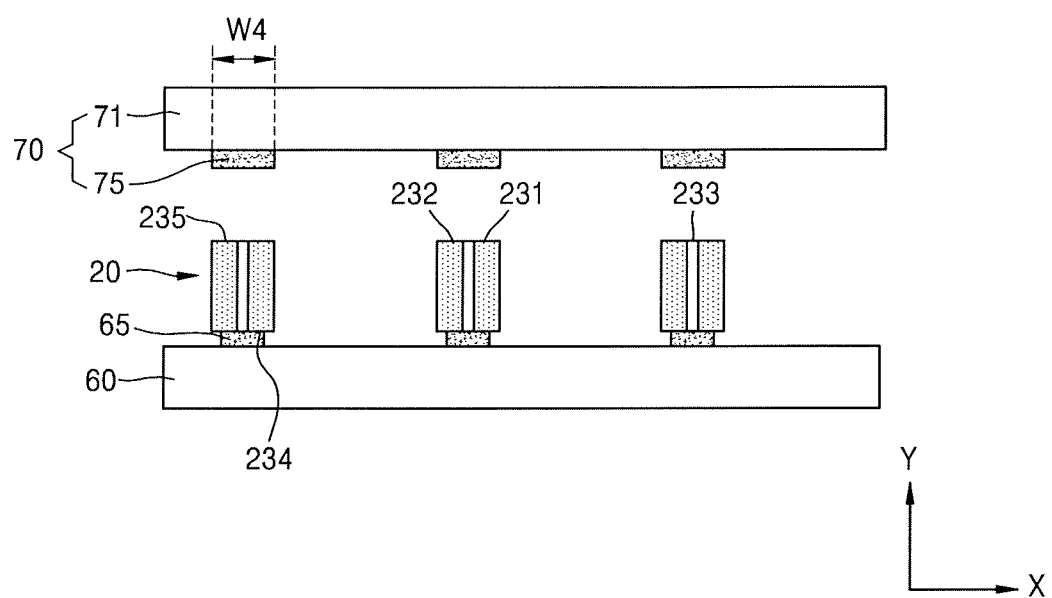

Referring to FIG. 13, the light-emitting diodes 20 may be vertically arranged after being rotated by about 90 degrees. The light-emitting diodes 20 may have the structure in which the first semiconductor layer 231, the intermediate layer 233, and the second semiconductor layer 232 are sequentially stacked in a direction (i.e., an X direction). The direction may be substantially parallel to the upper surface of the sacrificial substrate 60. For example, the first surface 234 of the light-emitting diode 20 may be in direct contact with the sacrificial substrate 60. The second surface 235 that is opposite the first surface 234 may be exposed in a direction that is opposite the direction facing the sacrificial substrate 60.

The light-emitting transfer may arrange the second stamper 70 above the sacrificial substrate 60. Based on images captured by, for example, the vision unit, a position of the sacrificial substrate 60 and a position of the second stamper 70 may be identified. Thus, the position of the second stamper 70 may be changed.

The second stamper 70 may include the plate 71. The second stamper 70 may include the pick-up portion 75. The pick-up portion 75 may protrude from the surface of the plate 71. The pick-up portion 75 may have an embossed pattern.

The plate 71 may include a metallic material. The metallic material may have a relatively strength. The plate 71 may include a plastic material. However, exemplary embodiments of the present invention are not limited thereto.

The pick-up portion 75 may include substantially the same material as the plate 71. The pick-up portion 75 may be formed separately from the plate 71. Alternatively, the pick-up portion 75 may be integrally formed with the plate 71. According to an exemplary embodiment of the present invention, the pick-up portion 75 may include an elastic material.

The pick-up portion 75 may attach the light-emitting diode 20 thereto. The pick-up portion 75 may attached the light-emitting diode 20 thereto by using electrostatic force, magnetic force, adsorptive power, or adhesion. However, the pick-up portion 75 is not limited thereto. The pick-up portion 75 may include all units or structures that may attach the light-emitting diodes 20 to the pick-up portion 75. For example, the pick-up portion 75 may have a holder structure for holding the light-emitting diodes 20. There may be a plurality of pick-up portions 75. The pick-up portions 75 may be arranged apart from each other in a direction of the plate 71, for example, in a horizontal direction in a vertical cross-section as illustrated in FIG. 13.

The light-emitting transfer may pick up the light-emitting diodes 20 from the sacrificial substrate 60 by lowering the second stamper 70. The second surface 235 of the light-emitting diode 20 may be attached to the pick-up portion 75 of the second stamper 70.

Figure 14:
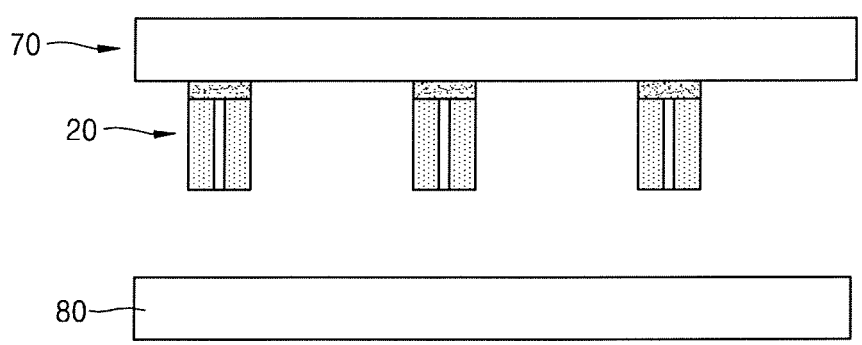

Referring to FIG. 14, the light-emitting transfer may arrange the second stamper 70, to which the light-emitting diodes 20 are attached, above the display substrate 80. Based on the images captured by, for example, the vision unit, the position of the second stamper 70 and the position of display substrate 80 may be identified. Thus, the position of the second stamper 70 may be changed.

The light-emitting transfer may arrange the light-emitting diodes 20 above the display substrate 80. The light-emitting transfer may release the light-emitting diodes 20 from the second stamper 70. Accordingly, the light-emitting diodes 20 may be vertically arranged over the display substrate 80.

The display substrate 80 may include the first electrode and the second electrode. The light-emitting transfer may arrange the light-emitting diodes 20 above the display substrate 80. The light-emitting transfer may arrange the light-emitting diodes 20 above the display substrate 80 so that the first semiconductor layer 231 and the second semiconductor layer 232 of the light-emitting diode 20 are electrically connected to the first electrode and the second electrode, respectively.

Figure 15:
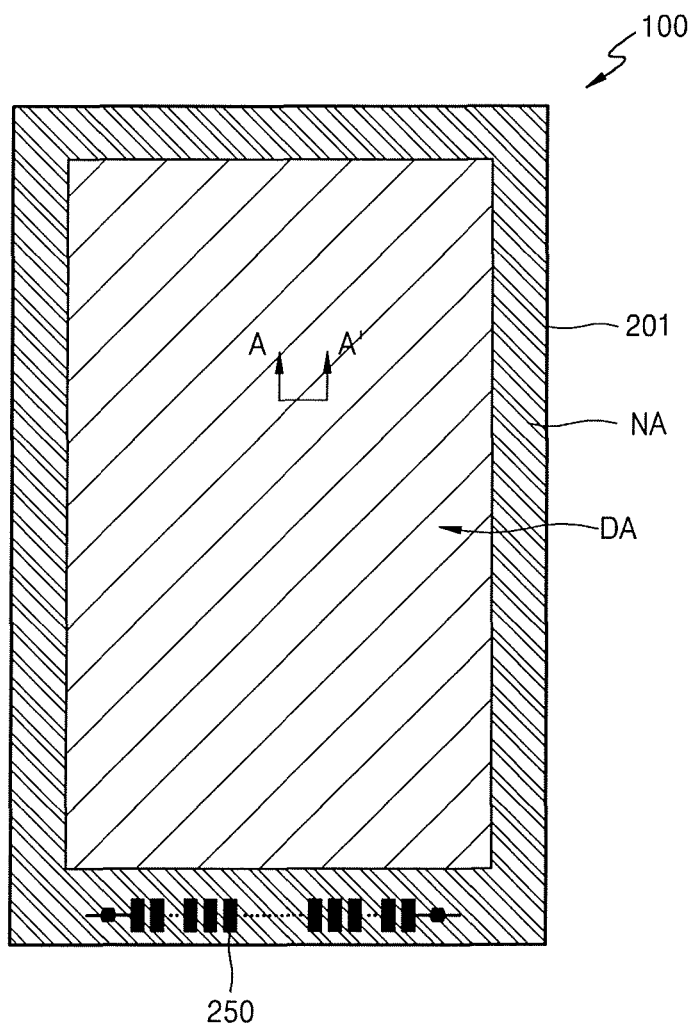
FIG. 15 is a schematic plan view illustrating a display apparatus according to an exemplary embodiment of the present invention.
Figure 16:
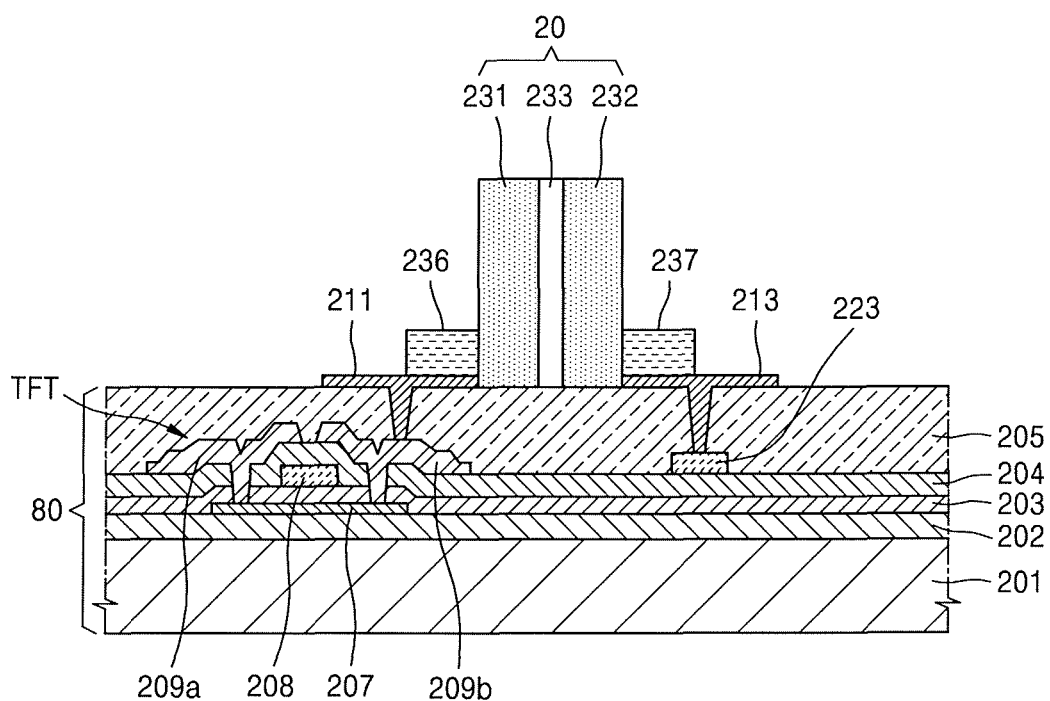
FIG. 16 is a schematic cross-sectional view of a cross-section taken along a line A-A' of a display apparatus of FIG. 15 according to an exemplary embodiment of the present invention.
Figure 17:
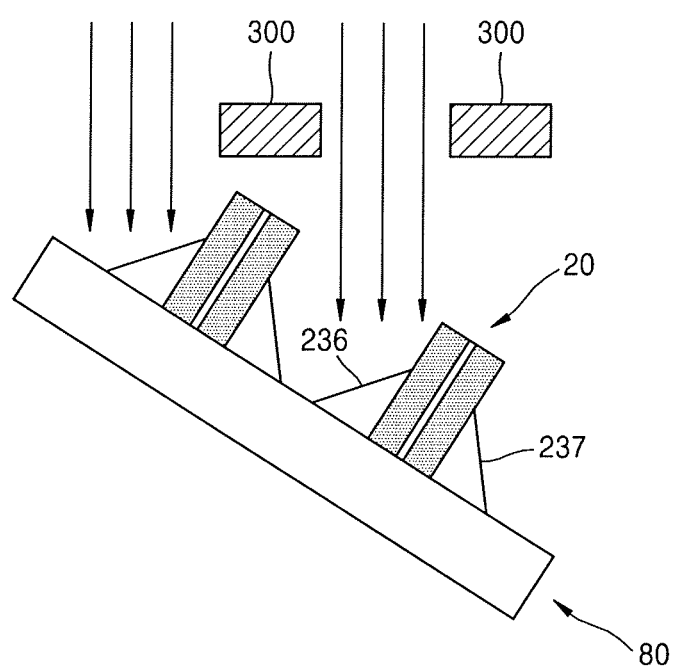
FIG. 17 is a schematic cross-sectional view of an example of forming a contact portion of FIG. 16 according to an exemplary embodiment of the present invention.

FIG. 15 is a schematic plan view illustrating a display apparatus formed according to an exemplary embodiment of the present invention. FIG. 16 is a schematic cross-sectional view of an example of a cross-section taken along a line A-A' of a display apparatus of FIG. 15 according to an exemplary embodiment of the present invention. FIG. 17 is a schematic cross-sectional view of an example of forming a contact portion of FIG. 16 according to an exemplary embodiment of the present invention.

Referring to FIGS. 15 and 16, a display apparatus 100 may include the display substrate 80 and the light-emitting diodes 20. The light-emitting diodes 20 may be disposed above the display substrate 80. The light-emitting diodes 20 may be vertically arranged above the display substrate 80. The light-emitting diodes 20 may be vertically arranged above the display substrate 80 so that the first semiconductor layer 231 and the second semiconductor layer 232 of the light-emitting diode 20 are exposed. The first semiconductor layer 231 and the second semiconductor layer 232 may be disposed on side surfaces of the light-emitting diode. For example, the first semiconductor layer 231 and the second semiconductor layer 232 may be disposed on the left side and the right side of the light-emitting diode 20, respectively.

The display substrate 80 may further include a substrate 201, a thin film transistor (TFT), and a planarization layer 205. The TFT may be disposed above the substrate 201. The planarization layer 205 may be disposed over the thin film transistor TFT. A first electrode 211 may be formed above the planarization layer 205. The first electrode 211 may be connected to the thin film transistor TFT. The first electrode 211 may be connected to the thin film transistor TFT through a via hole. A second electrode 213 may be formed above the planarization layer 205. The second electrode 213 may be connected to an auxiliary wire 223. The second electrode 213 may be connected to the auxiliary wire 223 through a contact hole. The auxiliary wire 223 may be formed above one of a plurality of insulating films disposed below the planarization layer 205. Referring to FIG. 16, the auxiliary wire 223 may be formed above an interlayer insulating layer 204. However, exemplary embodiments of the present invention are not limited thereto. The auxiliary wire 223 may be formed above a gate insulating layer 203.

Referring to FIG. 15, a display area DA may be defined above the substrate 201. A non-display area NA may also be defined above the substrate 201. The non-display area NA may be disposed outside the display area DA. The light-emitting diodes 20 may be arranged in the display area DA. Power wires or similar may be arranged in the non-display area NA. A pad portion 250 may be disposed in the non-display area NA.

The substrate 201 may include various materials. For example, the substrate 201 may include a transparent glass material. The transparent glass material may include silicon dioxide ($SiO_2$). However, the substrate 201 is not limited thereto. The substrate 201 may include a transparent plastic material. The transparent plastic material may be flexible. The transparent plastic material may include an organic material including polyethersulphone (PES), polyacrylate (PAR), polyetherimide (PEI), polyethylene napthalate (PEN), polyethylene terephthalate (PET), polyphenylene sulfide (PPS), polyarylate, polyimide, polycarbonate (PC), cellulose triacetate (TAC), or cellulose acetate propionate (CAP), which may be insulating organic materials; however, exemplary embodiments of the present invention are not limited thereto.

A buffer layer 202 may be disposed above the substrate 201. The buffer layer 202 may provide a substantially flat surface above the substrate 201. The buffer layer 202 may reduce or prevent foreign materials or moisture from penetrating through the substrate 201. For example, the buffer layer 202 may include an inorganic material including silicon oxide ($SiO_2$), silicon nitride (SiNx), silicon oxynitride (SiON), aluminum oxide ($Al_2O_3$), aluminum nitride (AlN), titanium oxide ($TiO_2$), or titanium nitride (TiN). Alternatively, the buffer layer 202 may include an organic material including polyimide, polyester, or acryl. The buffer layer 202 may have a structure in which the materials included in the buffer layer 202 are stacked on each other.

The thin film transistor TFT may include an active layer 207, a gate electrode 208, a source electrode 209a, and a drain electrode 209b.

Hereinafter, the thin film transistor TFT may a top-gate type thin-film transistor in which the active layer 207, the gate electrode 208, the source electrode 209a, and the drain electrode 209b are sequentially formed. However, exemplary embodiments of the present invention are not limited thereto. The thin film transistor TFT may be various types, for example, a bottom-gate type thin-film transistor.

The active layer 207 may include a semiconductor material, for example, amorphous silicon or polycrystalline silicon. However, exemplary embodiments of the present invention are not limited thereto. The active layer 207 may include various materials. For example, the active layer 207 may include an organic semiconductor material or an oxide semiconductor material. However, exemplary embodiments of the present invention are not limited thereto.

The gate insulating layer 203 may be disposed above the active layer 207. The gate insulating layer 203 may insulate the active layer 207 from the gate electrode 208. The gate insulating layer 203 may be a single layer. Alternatively, the gate insulating layer 203 may have multiple layers. The gate insulating layer 203 may include an inorganic material, such as $SiO_2$ and/or SiNx.

The gate electrode 208 may be disposed above the gate insulating layer 203. The gate electrode 208 may be connected to a gate line. The gate line may transmit an ON/OFF signal to the thin film transistor TFT. The gate electrode 208 may include a low resistance metallic material. The gate electrode 208 may be a single layer. Alternatively, the gate electrode 208 may have multiple layers. The gate electrode 208 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu); however, exemplary embodiments of the present invention are not limited thereto. The material included in the gate electrode 208 may be selected according to adhesion with an adjacent layer, surface planarization of a stacked layer, and workability.

The interlayer insulating layer 204 may be disposed above the gate electrode 208. The interlayer insulating layer 204 may insulate the source electrode 209a and the drain electrode 209b from the gate electrode 208. The interlayer insulating layer 204 may be a single layer. Alternatively, the interlayer insulating layer 204 may have multiple layers. The interlayer insulating layer 204 may include an inorganic material. For example, the inorganic material may be a metal oxide or a metal nitride. The inorganic material may include $SiO_2$, SiNx, SiON, $Al_2O_3$, $TiO_2$, tantalum oxide ($Ta_2O_5$), hafnium oxide ($HfO_2$), or zinc oxide ($ZnO_2$); however, exemplary embodiments of the present invention are not limited thereto.

The source electrode 209a and the drain electrode 209b may be disposed above the interlayer insulating layer 204. The source electrode 209a and the drain electrode 209b may each be a single layer. Alternatively, the source electrode 209a and the drain electrode 209b may each have multiple layers. The source electrode 209a and the drain electrode 209b may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), Mo, titanium (Ti), tungsten (W), or copper (Cu). The source electrode 209a and the drain electrode 209b may be in direct contact with a source region and a drain region of the active layer 207, respectively.

The auxiliary wire 223 may be disposed above the interlayer insulating layer 204. The auxiliary wire 223 may be a single layer. Alternatively, the auxiliary wire 223 may have multiple layers. The auxiliary wire 223 may include substantially the same material as in the source electrode 209a and the drain electrode 209b.

The planarization layer 205 may be disposed above the thin film transistor TFT. The planarization layer 205 may cover the thin film transistor TFT. The planarization layer 205 covering the thin film transistor TFT may remove a step difference generated by the thin film transistor TFT. Therefore, the planarization layer 205 may substantially flatten an upper surface of the interlayer insulating layer 204. The planarization layer 205 may be a single layer. Alternatively, the planarization layer 205 may have multiple layers. The planarization layer 205 may include an organic material. The organic material may include a general commercial polymer, such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof. The planarization layer 205 may include a composite stack structure. The composite stack structure may include an organic insulating layer and an inorganic insulating layer.

The first electrode 211 and the second electrode 213 may be disposed above the planarization layer 205.

The first electrode 211 may be electrically connected to the thin film transistor TFT. The first electrode 211 may be electrically connected to the drain electrode 209b. The first electrode 211 may be electrically connected to the drain electrode 209b through a via hole in the planarization layer 205. The first electrode 211 may be in various forms. For example, the first electrode 211 may be patterned in an island form.

The first electrode 211 and the second electrode 213 may be electrically separated from each other.

The light-emitting diodes 20 may emit red light, green light, or blue light. The light-emitting diodes 20 may further emit white light. The light-emitting diodes 20 may emit white light by using a fluorescent material or combining colors of light. The light-emitting diodes 20 may include the first semiconductor layer 231, the second semiconductor layer 232, and the intermediate layer 233. The intermediate layer 233 may be disposed between the first semiconductor layer 231 and the second semiconductor layer 232.

The first semiconductor layer 231 of the light-emitting diode 20 may be directly connected to the first electrode 211. Alternatively, the first semiconductor layer 231 of the light-emitting diode 20 may be electrically connected to the first electrode 211 through a first contact portion 236. The second semiconductor layer 232 may be directly connected to the second electrode 213. Alternatively, the second semiconductor layer 232 may be electrically connected to the second electrode 213 through a second contact portion 237.

The first contact portion 236 and the second contact portion 237 may have various forms. The first contact portion 236 and the second contact portion 237 may be formed after the light-emitting diodes 20 are disposed on the display substrate 80. For example, as illustrated in FIG. 17, after the light-emitting diodes 20 are disposed on the display substrate 80, metals may be deposited by a mask 300 in a state where the display substrate 80 is tilted at an angle. Thus, the first contact portion 236 and the second contact portion 237 may be formed. The first contact portion 236 may be formed by tilting the display substrate 80 twice right at an angle. The second contact portion 237 may be formed by tilting the display substrate 80 twice left at an angle.

However, the first contact portion 236 and the second contact portion 237 are not limited thereto. The first contact portion 236 and the second contact portion 237 may be formed by various methods, such as three-dimensional (3D) printing using an aerosol jet.

According to the one or more exemplary embodiments of the present invention, a direction, in which layers of light-emitting diodes are stacked, rotates by about 90 degrees when the light-emitting diodes are transferred from a base substrate to a display substrate. Thus, performing an etching process on the light-emitting diodes may be omitted. Additionally, a contact electrode may be formed without losing an area of the light-emitting diodes. Since the area of the light-emitting diodes is not lost, loss of an emission area may decrease, which may increase emission efficiency.

According to the one or more exemplary embodiments of the present invention, as light-emitting diodes are mounted on a display substrate, a display apparatus may be manufactured without a subsequent procedure and loss of an area of the light-emitting diodes.

It should be understood that exemplary embodiments of the present invention described herein should be considered in a descriptive sense only and not for purposes of limitation. Descriptions of features or aspects within each exemplary embodiment of the present invention should typically be considered as available for other similar features or aspects in other embodiments.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:

1. A method of transferring light-emitting diodes, the method comprising:
 picking up the light-emitting diodes from a base substrate by using a first stamper;
 rotating the light-emitting diodes by about 90 degrees and mounting the light-emitting diodes on the first stamper or a sacrificial substrate;
 picking up the rotated light-emitting diodes mounted on the first stamper or the sacrificial substrate by using a second stamper; and
 releasing the light-emitting diodes from the second stamper towards a display substrate.

2. The method of claim 1, wherein rotating and mounting of the light-emitting diodes comprises:
 rotating the first stamper on which the light-emitting diodes are arranged; and
 rotating the light-emitting diodes by about 90 degrees by pressing the light-emitting diodes on the first stamper.

3. The method of claim 2, wherein, after the light-emitting diodes are rotated by about 90 degrees,
 a layer stack direction of the light-emitting diodes arranged over the first stamper is substantially perpendicular to a layer stack direction of the light-emitting diodes arranged over the base substrate.

4. The method of claim 1, wherein rotating and mounting of the light-emitting diodes comprises:
 releasing the light-emitting diodes from the first stamper towards the sacrificial substrate; and
 rotating the light-emitting diodes by about 90 degrees by stretching the sacrificial substrate.

5. The method of claim 4,
 wherein an upper surface of the sacrificial substrate comprises a first region which is adhesive and a second region which is not adhesive, and
 wherein after the sacrificial substrate is stretched, a layer stack direction of the light-emitting diodes arranged above the first region of the sacrificial substrate is substantially perpendicular to a layer stack direction of the light-emitting diodes arranged over the base substrate.

6. The method of claim 5, wherein before the sacrificial substrate is stretched,
 an upper surface of the sacrificial substrate comprises a first region substantially perpendicular to a lower surface of the sacrificial substrate and a second region, the second region forming an acute angle with the first region.

7. The method of claim 6, wherein the first region of the sacrificial substrate comprises an adhesive.

8. The method of claim 1,
wherein the light-emitting diodes arranged over the base substrate comprise a structure in which a first semiconductor layer, an intermediate layer, and a second semiconductor layer are stacked on the base substrate in a first direction, the first direction substantially perpendicular to an upper surface of the base substrate, and
wherein the light-emitting diodes arranged over the display substrate comprise a structure in which the first semiconductor layer, the intermediate layer, and the second semiconductor layer are stacked on the display substrate in a second direction, the second direction substantially perpendicular to the first direction.

9. The method of claim 1, further comprising
electrically connecting the light-emitting diodes to a first electrode and a second electrode, the first electrode and the second electrode being disposed on a layer of the display substrate.

10. The method of claim 9, wherein the electrically connecting of the light-emitting diodes comprises
forming a first contact portion and a second contact portion, the first contact portion used to connect a first semiconductor layer of the light-emitting diodes to the first electrode of the display substrate and the second contact portion used to connect a second semiconductor layer of the light-emitting diodes to the second electrode of the display substrate.

11. A method of transferring light-emitting diodes, the method comprising:
picking up the light-emitting diodes from a base substrate by using a first stamper;
rotating the first stamper on which the light-emitting diodes are disposed ever by about 90 degrees;
rotating the light-emitting diodes by about 90 degrees by pressing the light-emitting diodes over the first stamper;
picking up the rotated light-emitting diodes disposed over the first stamper by a second stamper; and
releasing the light-emitting diodes from the second stamper towards a display substrate.

12. The method of claim 11, wherein after the light-emitting diodes rotate by about 90 degrees,
a layer stack direction of the light-emitting diodes disposed over the first stamper is substantially perpendicular to a layer stack direction of the light-emitting diodes disposed over the base substrate.

13. The method of claim 12,
wherein the light-emitting diodes disposed over the base substrate comprise a structure in which a first semiconductor layer, an intermediate layer, and a second semiconductor layer are stacked on the base substrate in a first direction, the first direction substantially perpendicular to an upper surface of the base substrate, and wherein the light-emitting diodes disposed over the display substrate comprise a structure in which the first semiconductor layer, the intermediate layer, and the second semiconductor layer are stacked on the display substrate in a second direction, the second direction substantially perpendicular to the first direction.

14. The method of claim 11, wherein the light-emitting diodes are picked up from the base substrate by lowering the first stamper.

15. The method of claim 11, further comprising
electrically connecting the light-emitting diodes to a first electrode and a second electrode, the first electrode and the second electrode being disposed on a layer of the display substrate.

16. A method of transferring light-emitting diodes, the method comprising:
picking up the light-emitting diodes from a base substrate by using a first stamper;
releasing the light-emitting diodes from the first stamper towards a sacrificial substrate;
rotating the light-emitting diodes disposed over the sacrificial substrate by about 90 degrees by stretching the sacrificial substrate;
picking up the rotated light-emitting diodes disposed over the sacrificial substrate by using a second stamper; and
releasing the light-emitting diodes from the second stamper towards a display substrate.

17. The method of claim 16,
wherein an upper surface of the sacrificial substrate comprises a first region which is adhesive and a second region which is not adhesive, and
wherein after the sacrificial substrate is stretched, a layer stack direction of the light-emitting diodes disposed over the first region is substantially perpendicular to a layer stack direction of the light-emitting diodes disposed over the base substrate.

18. The method of claim 16,
wherein the light-emitting diodes disposed over the base substrate comprise a structure in which a first semiconductor layer, an intermediate layer, and a second semiconductor layer are stacked on the base substrate in a first direction, the first direction substantially perpendicular to an upper surface of the base substrate, and
wherein the light-emitting diodes disposed over the display substrate comprise a structure in which the first semiconductor layer, the intermediate layer, and the second semiconductor layer are stacked in a second direction, the second direction substantially perpendicular to the first direction.

19. The method of claim 16, wherein the light-emitting diodes are picked up from the base substrate by lowering the first stamper.

20. The method of claim 16, further comprising
electrically connecting the light-emitting diodes to a first electrode and a second electrode, the first electrode and the second electrode being disposed on a layer of the display substrate.

* * * * *